United States Patent [19]
Crumly et al.

[11] Patent Number: 5,946,555
[45] Date of Patent: Aug. 31, 1999

[54] WAFER LEVEL DECAL FOR MINIMAL PACKAGING OF CHIPS

[75] Inventors: William R. Crumly, Anaheim; Haim Feigenbaum, Irvine, both of Calif.

[73] Assignee: Packard Hughes Interconnect Company, Irvine, Calif.

[21] Appl. No.: 08/743,608

[22] Filed: Nov. 4, 1996

[51] Int. Cl.[6] ............ H01L 21/44; H01L 21/48; H01L 21/50
[52] U.S. Cl. ............ 438/125; 438/106; 438/118
[58] Field of Search ................... 438/125, 118, 438/106

[56] References Cited

U.S. PATENT DOCUMENTS

| | | |
|---|---|---|
| 5,207,887 | 5/1993 | Crumly et al. ............ 205/78 |
| 5,422,313 | 6/1995 | West ............ 438/123 |
| 5,521,122 | 5/1996 | Kuramochi ............ 438/125 |
| 5,658,827 | 8/1997 | Aulicino et al. ............ 438/125 |

*Primary Examiner*—Kevin M. Picardat
*Assistant Examiner*—D. Mark Collins
*Attorney, Agent, or Firm*—Patrick M. Griffin

[57] ABSTRACT

The invention includes the use of a decal to produce a packaged chip either at the chip level or wafer level. The decal includes a substrate containing circuitry that routes the chip output pads to bumps prepared for package attachment to another substrate such as a printed circuit board. The decal can be applied either to the wafer or to a single chip. The decal protects the chip and if necessary changes the interconnection density so that the chip can be interfaced with a printed circuit board or other electronic device. This configuration also may allow the packaged integrated circuit to be tested utilizing the bumps on the decal as temporary electrical contact features.

13 Claims, 1 Drawing Sheet

5,946,555

WAFER LEVEL DECAL FOR MINIMAL PACKAGING OF CHIPS

TECHNICAL FIELD

This invention relates to packaged chips and methods of making the same.

BACKGROUND OF THE INVENTION

There are a variety of methods of packaging integrated circuit chips. Usually a package is adhered to an integrated circuit chip or the integrated circuit chip placed into the package and mechanically secured thereto. Most packages included a single-chip. However, multiple chips may be placed in a package which is made by a spin-on type techniques producing high density multi-layer interconnections.

For the most part, integrated circuit chips are manufactured and packaged in separate locations primarily for cost reasons. Heretofore, there has not been a simple cost effective method of packaging a chip at the semi-conductor manufacturing facility.

The present invention provides alternatives and advantages over the prior art.

SUMMARY OF THE INVENTION

The invention includes the use of a decal to produce a packaged chip either at the chip level or wafer level. The decal includes a substrate containing circuitry that routes the chip output pads to bumps prepared for package attachment to another substrate such as a printed circuit board. The decal can be applied either to the wafer or to a single chip. The decal protects the chip and if necessary changes the interconnection density so that the chip can be interfaced with a printed circuit board or other electronic device. This configuration also may allow the packaged integrated circuit to be tested utilizing the bumps on the decal as temporary electrical contact features.

These and other objects, features and advantages will become apparent from the following brief description of the drawings, detailed description and appended claims and drawings.

DETAILED DESCRIPTION

Figure 1:
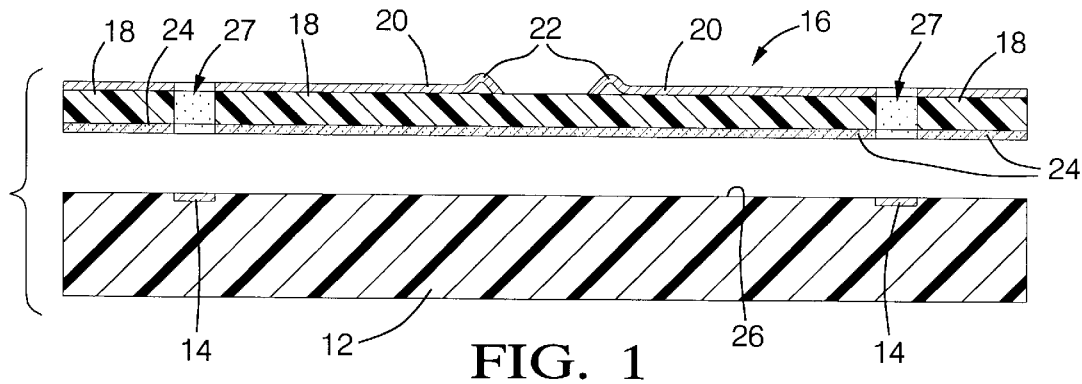
FIGS. 1–4 illustrate a packaged integrated circuit chip and method of making the same according to the present invention.
Figure 2:
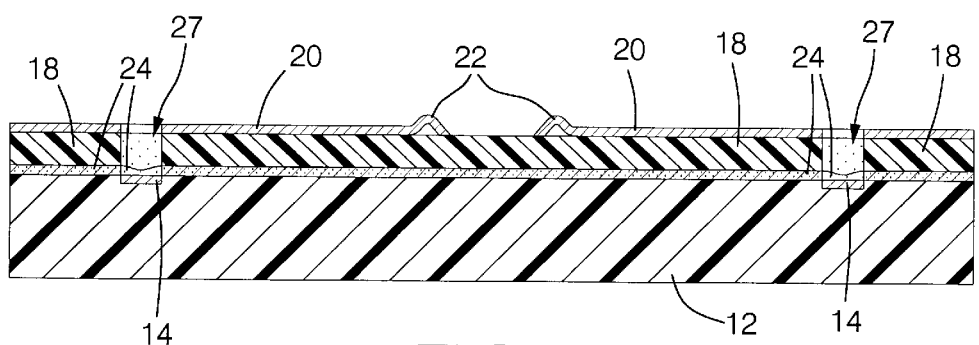
Figure 3:
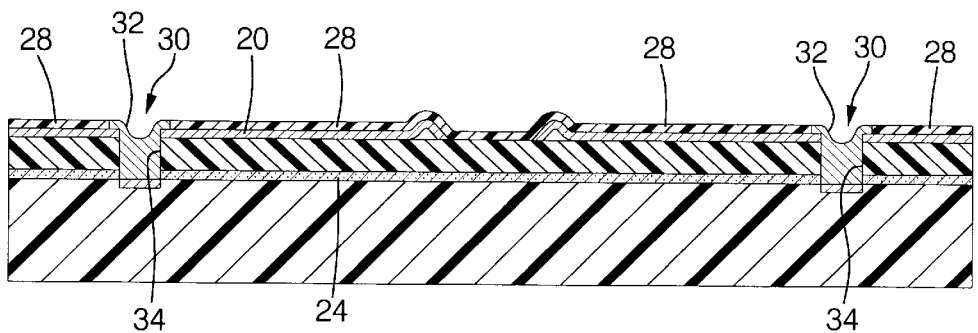

A packaged integrated circuit chip 10 may be prepared according to the present invention utilizing an integrated circuit chip 12, typically made from silicon having a circuit defined therein and associated contact pads 14. A substrate decal 16 is provided and may include a flexible carrier 18. The decal includes a copper trace 20 carried thereon and an associated raised electrical contact feature 22. The decal 16 is preferably a flexible circuit having a polyimide layer, but may be an organic or circuit board material. A suitable method of making a flexible circuit is described in Crumly et al, U.S. Pat. No. 5,207,887, entitled "Semi-Additive Circuitry with Raised Features Using Formed Mandrels," issued May 4, 1993, the disclosure of which is hereby incorporated by reference. If the flexible circuit is made by such a method, a thin flash copper layer (not shown) may overlie the copper trace. The flexible circuit may have an adhesive layer 24 secured to an underside. Alternatively, an adhesive layer may be applied to the top surface 26 of the integrated circuit chip 12. Through holes 27 are formed through the polyimide 18 and adhesive layers 24 and the flex circuit is laminated to the top 26 of the integrated circuit chip 12 with the through holes aligned with the contact pads 14 on the chip.

During the lamination process some adhesive 24 may be squeezed out into the through hole area 28 and may overlie the contact pads 14. The adhesive 24 squeezed out over the contact pads may be removed by a variety of methods such as plasma or chemical etch, or mechanical or laser skiving to a provide a via extending through the flexible circuit down to the contact pad.

Figure 4:
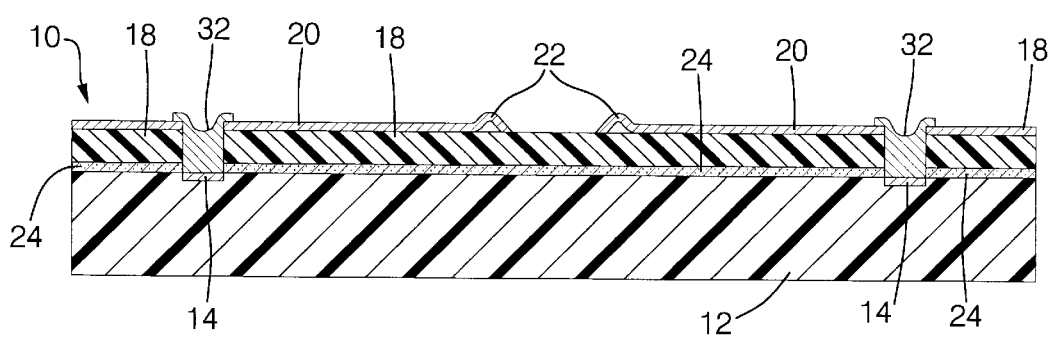

A mask 28 may be selective deposited over the top of the flex circuit and selective areas 30 exposed for depositing an electrical conductive material 32 into the vias overlying the contact pads. The electrically conductive material 32 may include for example, copper, gold, nickel, palladium, tin and lead, and may be deposited by a variety of methods including sputtering and electrolysis deposition. The deposited electrically conductive material covers the contact pads and extends up a wall 34 forming the via to make contact with the electrical trace 20. The mask 28 is removed and the flash copper (if any) is etched away to provide a packaged integrated circuit chip 10 according to the present invention as illustrated in FIG. 4. A coverlay may be applied as required.

The decal can be applied to an entire wafer chips before they are cut into individual chips. This operation can be done at the semi-conductor fabrication facility or elsewhere. In any event, since all of the chips in a wafer are encapsulated at once, the cost of packaging for each chip is very low. Alternatively, individual chips may be bonded to the flexible circuit decal. While the cost savings realized may not be as great as if the whole wafer was encapsulated, single chip decal bonding can be used when the semi-conductor vendor only supplies singulated chips.

A mandrel method of making a flex circuit with raised features as described in Crumly et al U.S. Pat. No. 5,207,887, the disclosure of which is hereby incorporated by reference and is generally described as follows. A stainless steel plate forms a mandrel having a forming surface in which is provided one or a plurality of depressions or dimples, which will define raised features of the resulting circuitry. The mandrel and its depression or depressions is then coated with a copper coating, typically referred to as flash plated, which covers the entire surface of the mandrel, including the surface of the depressions. The flash plated copper is applied by electroplating or other known techniques and provides a thin conductive coating that prevents the adhesive (that will be used to laminate the circuit substrate) from adhering to the mandrel surface. Flash plating is a conventional electrolytic plating formed in a very short or momentary operation so that only a very thin plating coat is provided. The flash plated coat is very thin compared to the thickness of the electrical circuit traces that are made. For example, for a circuit trace of 1½ mil thickness, a flash plating of copper on the mandrel will have a thickness of 0.01 to 0.2 mils. The thin flash plating is employed because it can be relatively easily released from the stainless steel mandrel, and, in addition, may be readily removed from the lamination after separation from the mandrel by a flash etching, which is a very short time or momentary etching process. Obviously, other methods for coating the mandrel with a very thin coat of conductive material that is readily separable from the mandrel and which can be readily removed from the completed circuit traces may be employed in the place of the electrolytic flash plating. Such methods may include sputtering, vapor deposition and electroless plating. If deemed necessary or desirable, the mandrel may be made of a non-electrically conductive material because the thin electrically conductive coating itself enables the additive electroplating of the circuit traces and raised features. The coating, for a dielectric mandrel, can be applied by electroless plating, sputtering, or additional conductive particles in solution. No pattern of non-conductive material, such as Teflon, is permanently affixed to the mandrel. Instead, the flash plated copper is coated with a photoresist, which is then optically exposed through a mask defining a pattern of the desired circuit and developed. The photoresist that has not been polymerized is then remove to leave the partially completed assembly in the configuration illustrated. The flash plated copper coating now bears a pattern of photoresist that is a negative pattern of the circuit trace pattern to be fabricated with this mandrel.

The mandrel assembly is then subjected to a suitable additive electroforming process, such as, for example, electroplating, to plate up copper traces, including trace and a raised feature pad, including a raised feature in the depression. The copper traces are plated directly onto those portions of the flash plated copper coating that are not covered by the negative pattern of developed photoresist. Thus the plating process simultaneously forms both the circuit traces and the raised features. The raised features are partly hollow, having a depression or dimple. If deemed necessary or desirable, the depress formed in the electroplated raised feature may be filled with a solid material by placing a dollop of epoxy in the depression and then allowing the epoxy to cure.

The photoresist is then stripped to leave the circuit traces and raised features on the flash plated copper coating which is still on the mandrel. Now a layer of a suitable dielectric and adhesive, such as, for example, a layer of Kapton® and an adhesive, are laminated to the mandrel assembly with the traces and circuit features thereon under suitable high temperatures and pressures. This causes the Kapton and adhesive to flow into the spaces between the traces and thereby contact traces and pads on three sides. Only that side of the traces and pads that is directly in contact with the flash plated copper on the mandrel is not contacted by the adhesive substrate. The assembly now includes the mandrel, the flash plated copper, traces, pads and features, and the Kapton®/adhesive substrate.

The circuit assembly is then removed from the mandrel. Because only the flash plated copper contacts the mandrel, this may be readily separated, and no adhesive of the substrate is in contact with the mandrel. Thus it will be seen that because the mandrel has been initially coated with the protective layer of the flash plated copper, the assembly of dielectric/adhesive substrate and circuit traces and raised features can be readily separated from the mandrel, together with the flash plated copper coating.

After separation from the mandrel, the flash plated copper coating, which covers the entire lower surface of the assembly is removed by a flash etching process to yield the finished or substantially finished sub-assembly. The sub-assembly is ready for the coverlay lamination, which comprises the standard process for covering at least the side of the sub-assembly bearing the conductive traces with an insulative coverlay.

If deemed necessary or desirable, the removal of the flash plated copper coating may be controlled by a "stop" layer of gold or nickel, which will protect the thicker copper circuit during flash etch removal of the flash plated copper. To this end, the flash coated mandrel with its photolithographically defined resist pattern in place, may be plated with a thin layer of gold, about 0.00006 inches thick, upon which the circuitry will be plated. This patterned gold "stop" layer allows the flash plated copper to be removed by the flash etching from the dielectric, but protects the copper circuit.

We claim:

1. A method of packaging a semi-conductor device comprising:

securing a substrate having a circuit thereon to a semi-conductor device having a circuitry defined therein and an associated contact pad, the substrate including electrically conductive traces, the traces including raised electrical contact features extending above the plane of the electrical traces, the substrate having a through hole formed therein intersecting a trace and aligned with a contact pad on the semi-conductor device to provide a via from the electrically conductive trace to the contact pad, moving a substrate surface surrounding the through hole into contact with a surface of the semi-conductor device containing the contact pad, and depositing an electrically conductive material in the via to make an electrical connection between the contact pad and the electrically conductive trace.

2. A method as set forth in claim 1 wherein the semi-conductor device is a semi-conductor wafer for making a plurality of semi-conductor chips.

3. A method as set forth in claim 1 wherein the semi-conductor device is an integrated circuit chip.

4. A method as set forth in claim 1 wherein the semi-conductor device is a multi-chip module.

5. A method as set forth in claim 1 wherein the substrate is flexible.

6. A method of making a packaged semi-conductor device comprising:

providing a semi-conductor device having a circuitry defined therein including a contact pad, providing a carrier layer and an electrical trace formed on the carrier layer including a raised electrical contact feature, an adhesive layer secured to an underside of the carrier layer, the carrier layer having a through hole formed therein for alignment with the contact pad, a thin flash copper layer over the electrical trace, laminating the carrier layer to the semi-conductor device so that the through hole aligns with and overlies the contact pad and a connection between the through hole and the semi-conductor is a sealed connection, removing any adhesive squeeze-out overlying the contact pad to define a via extending from the contact pad to the electrical trace and selectively depositing an electrically conductive material into the via to provide an electrical path from the contact pad to the electrical trace, and removing the thin flash copper layer over the electrical trace.

7. A method as set forth in claim 6 wherein the carrier layer is a flexible material.

8. A method as set forth in claim 6 wherein the adhesive squeeze-out is removed by skiving.

9. A method as set forth in claim 6 further comprising the step of selectively masking the carrier layer prior to depositing said electrically conductive material.

10. A method as set forth in claim 9 wherein the electrical conductive material comprises at least one selected from the group consisting of copper, gold, nickel, palladium, tin and lead.

11. A method as set forth in claim 8 wherein the flexible layer comprises a polyimide material.

12. A method as set forth in claim 9 wherein the flexible layer is a dielectric material.

13. A method as set forth in claim 10 wherein the electrically conductive material is deposited by sputtering or electroless processing.

* * * * *